United States Patent [19]

Suzuki et al.

[11] Patent Number: 4,761,242
[45] Date of Patent: Aug. 2, 1988

[54] PIEZOELECTRIC CERAMIC COMPOSITION

[75] Inventors: Kazunori Suzuki, Nagoya; Masataka Naitoh, Kariya, both of Japan

[73] Assignee: Nippondenso Co., Ltd., Kariya, Japan

[21] Appl. No.: 867,953

[22] Filed: May 29, 1986

[30] Foreign Application Priority Data

May 30, 1985 [JP] Japan ................. 60-117169

[51] Int. Cl.$^4$ ............................ C04B 35/46
[52] U.S. Cl. ..................... 252/62.9; 501/134; 501/135; 501/136
[58] Field of Search .......... 501/134, 135, 136; 252/62.9

[56] References Cited

U.S. PATENT DOCUMENTS

| | | | |
|---|---|---|---|
| 2,911,370 | 11/1959 | Kulcsar | 252/62.9 |
| 3,468,799 | 9/1969 | Kurihara et al. | 252/62.9 |
| 3,476,951 | 11/1969 | Pulvari | 501/134 X |
| 3,594,321 | 7/1971 | Ohno et al. | 252/62.9 |
| 3,630,909 | 12/1971 | Banno et al. | 252/62.9 |
| 3,956,150 | 5/1976 | Ouchi et al. | 252/62.9 |
| 3,963,630 | 6/1976 | Yonezawa et al. | 252/62.9 |
| 3,998,748 | 12/1976 | Nishida et al. | 252/62.9 |
| 4,073,846 | 2/1978 | Masumura et al. | 501/134 X |
| 4,119,554 | 10/1978 | Fujiwara | 501/134 X |
| 4,255,272 | 3/1981 | Ogawa | 252/62.9 |
| 4,265,668 | 5/1981 | Fujiwara et al. | 501/134 |
| 4,313,839 | 2/1982 | Fesenko et al. | 252/62.9 |
| 4,601,841 | 7/1986 | Yasuda et al. | 252/62.9 |

FOREIGN PATENT DOCUMENTS

| | | | |
|---|---|---|---|
| 45-14465 | of 1970 | Japan . | |
| 50-34312 | 4/1975 | Japan | 252/62.9 R |
| 025376 | 6/1979 | Japan . | |
| 076924 | 1/1981 | Japan . | |
| 0010282 | 1/1982 | Japan . | |
| 142912 | 4/1982 | Japan . | |
| 0145384 | 9/1982 | Japan . | |
| 053756 | of 1984 | Japan . | |
| 125943 | of 1984 | Japan . | |
| 61-1276279 | 12/1986 | Japan . | |
| 1185900 | 3/1970 | United Kingdom . | |
| 460271 | 2/1975 | U.S.S.R. | 501/134 |

OTHER PUBLICATIONS

Jaffe, Bernard, "Piezoelectric Ceramics", 1971, pp. 152 & 201, Academic Press, London/NY.

Primary Examiner—William R. Dixon, Jr.
Assistant Examiner—Ann M. Knab
Attorney, Agent, or Firm—Cushman, Darby & Cushman

[57] ABSTRACT

A piezoelectric ceramic composition is disclosed wherein a sintered body having a bismuth layer structure represented by a molecular formula of $PbBi_4Ti_4O_{15}$ contains 10 to 55 mol % of an oxide of Ca and Ti, namely $CaTiO_3$, or 1 to 15 mol % of an oxide of Sr and Ti, namely, $SrTiO_3$. The bismuth layer structure of $PbBi_4Ti_4O_{15}$ has a positive dielectric-constant-temperature characteristic, and $CaTiO_3$ or $SrTiO_3$ is obtained by sintering as an added substance exhibiting a negative dielectric-constant-temperature characteristic. Since the added substance is added to the piezoelectric ceramic composition so that the temperature changes in both dielectric constants are mutually cancelled out, thereby maintaining the piezoelectric constants at a substantially fixed level.

14 Claims, 2 Drawing Sheets

PIEZOELECTRIC CERAMIC COMPOSITION

FIELD OF THE PRESENT INVENTION

The present invention relates to a piezoelectric ceramic composition which is effective in use for a pressure detector or the like, and more particularly, to improvements in the temperature characteristics of the piezoelectric constant of such a piezoelectric ceramic composition.

BACKGROUND OF THE INVENTION

Detection elements for use with pressure detectors have heretofore been known which utilize the piezo-resistance effect of Si and a piezoelectric material such as rock crystal, PZT, and so forth.

Among these conventional elements, an element relying upon the piezo-resistance effect of Si cannot be used at a very high temperature since its effective temperature range is limited. Another element utilizing rock crystal is capable of withstanding relatively high temperatures, but it is inferior in detection sensitivity since its piezoelectric constant is not very large. In the case of the PZT piezoelectric element, its effective temperature range is limited, so that it is still difficult to use the element at high temperatures and its hysteresis with respect to pressure is disadvantageously large.

To overcome these problems, the specification of Japanese Patent Examined Publication No. 16379/1980 has proposed a piezoelectric ceramic composition which eliminates the above noted disadvantages by using a sintered body having a bismuth layer structure of $PbBi_4Ti_4O_{15}$ in which the temperature-dielectric constant characteristic is relatively stable up to a high temperature region, and a small amount of MnO is added to the sintered body with a view to further improving the temperature characteristics.

However, it has been found during the experiments and studies conducted by the inventors that the abovedescribed conventional piezoelectric ceramic composition composed of MnO added to $PbBi_4Ti_4O_{15}$ involves disadvantage in that the temperature-dependent change rate of the dielectric constant of a ferroelectric substance having a bismuth layer structure exceeds 10% within the range, for example, between a normal temperature (about 25° C.) and 150° C. even if MnO is added, that is, the dielectric constant still changes greatly in relation to temperature. In general, the piezoelectric constant $d_{33}$ of a piezoelectric material is represented by the following equation $$d_{33} = k_{33} \sqrt{\epsilon_{33}^T / Y_{33}^E}$$

In this equation, it has been found that the piezoelectric constant $d_{33}$ is most seriously affected by the dielectric constant $\epsilon^T_{33}$ among the parameters contained on the right side of the equation, i.e., $K_{33}$ (coupling factor), $\epsilon^T_{33}$ (dielectric constant) and $Y^E_{33}$ (Young's modulus).

Hence, the above-mentioned prior-art piezoelectric ceramic composition still cannot prevent significant changes in the piezoelectric constant $d_{33}$ due to temperature changes, and thus a compensation circuit is indispensable in order that these changes can be compensated for. As a result, another problem is raised in that the compensation circuit must be made complicated under circumstances in which temperature changes to a remarkable extent.

SUMMARY OF THE INVENTION

Accordingly, an object of the present invention is to provide a piezoelectric ceramic composition wherein a sintered body having a bismuth layer structure represented by a molecular formula of $PbBi_4Ti_4O_{15}$ contains 10 to 55 mol % of an oxide of Ca and Ti, namely, $CaTiO_3$, or alternatively, 1 to 15 mol % of an oxide of Sr and Ti, namely, $SrTiO_3$.

In accordance with the present invention, the piezoelectric ceramic composition is composed of a ferroelectric substance having a bismuth layer structure of $PbBi_4Ti_4O_{15}$ showing a positive dielectric constant-temperature characteristic and an additional substance in the state of solid-solution which substance has a negative dielectric constant-temperature characteristic and is sintered into an oxide such as $CaTiO_3$ or $SrTiO_3$. Since the additional substance is added to the piezoelectric ceramic composition in such a manner as to form a solid solution, the temperature-dependent changes in both dielectric constants are mutually cancelled out, thereby maintaining the dielectric constants at a constant level.

Therefore, the piezoelectric ceramic composition of this invention exhibits a fixed dielectric constant irrespective of temperature changes, thereby showing a substantially fixed piezoelectric constant irrespective of temperature changes.

As will be readily understood from the foregoing, the present invention possesses excellent advantage in that it is possible to provide a piezoelectric ceramic composition which dispenses with the need for temperature compensation in respect of the piezoelectric constant even in a place exposed to temperature changes.

The above and other objects, features and advantages of the present invention will become apparent from the following description of the preferred embodiment and several examples thereof, taken in conjunction with the accompanying drawings.

DESCRIPTION OF THE PREFERRED EMBODIMENT

A piezoelectric ceramic composition of the present invention provides a centered body having a bismuth layer structure represented by a formula of $PbBi_4Ti_4O_{15}$ containing 5 to 55 mole % of an oxide of calcium or titanium, namely, $CaTiO_3$, or 1 to 15 mole % of an oxide of Sr and Si, namely, SrTiO$_3$. The bismuth layer structure of PbBi$_4$Ti$_4$O$_{15}$ has a positive dielectric-constant-temperature characteristic, and CaTiO$_3$ or SrTiO$_3$ is obtained by sintering as an added substance exhibiting a negative dielectric-constant temperature characteristic. Since the added substance is added to the piezoelectric ceramic composition so that the temperature changes in both dielectric constants are mutually cancelled out, whereby the piezoelecric constant is maintained at a substantially fixed level.

One preferred embodiment of the present invention will be described below with reference to the accompanying drawings.

Figure 1:
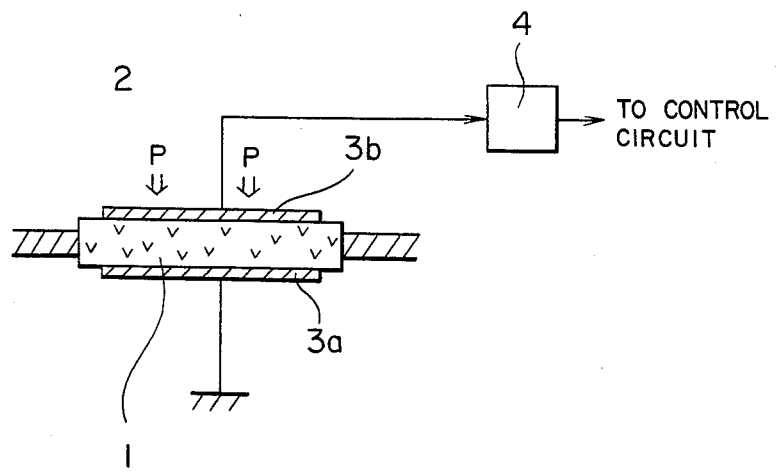
FIG. 1 is a schematic diagram of the structural principle of a pressure detector which incorporates the piezoelectric ceramic composition of this invention.

FIG. 1 is a schematic diagram showing the structural principle of the case where the piezoelectric ceramic composition of this invention is applied to a pressure detector. A piezoelectric ceramic composition 1 has a bismuth layer structure of PbBi$_4$Ti$_4$O$_{15}$ which contains 0.005-0.7 wt % of MnO (preferably 0.2 wt %) for the purpose of adjusting its specific resistance to the level of 10$^{12}$ to 10$^{13}$ $\Omega$cm, and CaTiO$_3$ is added at various rates as desired. The piezoelectric ceramic composition 1 is formed in a plate-like shape and is arranged to generate the quantity of electric charge Q on both end surfaces thereof in response to pressure changes within a chamber 2 for detecting applied pressure. Ag electrodes are formed by screen printing and etc. on both surfaces of the piezoelectric ceramic composition 1, one electrode 3a being grounded while the other electrode 3b is connected to a charge amplifier 4. By this arrangement measurement is performed as to the quantity of electric charge Q generated in response to a pressure P within the applied-pressure detecting chamber 2, whereby the pressure P is detected by a control circuit (not shown) on the basis of the previously obtained quantity of electric charge and the characteristic of the pressure.

The composition of the piezoelectric ceramic composition 1 and the manufacturing method thereof will be described in detail hereinbelow by reference to examples.

The powders of PbO, Bi$_2$O$_3$, TiO$_2$, MnCO$_3$ and CaTiO$_3$ were compounded in accordance with the respective weights shown in Table 1, and the compound thus obtained was used as a parent material.

TABLE 1

| No. | RAW MATERIAL | | | | | |
|---|---|---|---|---|---|---|
| | PbO (g) | Bi$_2$O$_3$ (g) | TiO$_2$ (g) | MnCO$_3$ (g) | CaTiO$_3$ (g) | CaTiO$_3$ (mol %) |
| 1 | 302.7 | 1263.8 | 433.4 | 6.5 | 0 | 0 |
| 2 | 301.2 | 1257.8 | 431.3 | 6.5 | 9.7 | 5 |
| 3 | 299.6 | 1251.1 | 429.0 | 6.2 | 20.3 | 10 |
| 4 | 297.9 | 1243.7 | 426.5 | 6.4 | 32.0 | 15 |
| 5 | 295.9 | 1235.5 | 423.7 | 6.3 | 45.1 | 20 |
| 6 | 293.7 | 1226.3 | 420.5 | 6.3 | 59.6 | 25 |
| 7 | 288.4 | 1204.1 | 412.9 | 6.2 | 94.6 | 35 |
| 8 | 281.5 | 1175.2 | 403.0 | 6.0 | 140.3 | 45 |
| 9 | 272.0 | 1135.9 | 389.5 | 5.8 | 202.6 | 55 |

1.5 l of water was added to the thus-compounded raw material, and they were mixed in a wet state. After they had been dried, they were calcinated at a temperature of 900° C. for two hours. Additional water was added to the thus-calcinated material, which was wet-ground. After drying, several wt % of an organic binder such as polyvinyl alcohol was compounded with the dried powder. The powder thus compounded was charged into a predetermined mold, and, under a pressure of 1 ton/cm$^2$, was pressure-molded in the shape of a disc having a diameter of 24 mm and a thickness of 8 mm.

Subsequently, the molded disc was sintered at a temperature of 1150° C. for two hours.

The thus-obtained sintered body was worked into a disc having a thickness of 1 mm, and Ag electrodes were formed on both sides of this disc by screen printing. While holding the worked disc in a silicone oil at 180° C., a DC voltage of 5 kV/mm was applied to the disc for ten minutes, thereby effecting polarization thereof.

Subsequently, in order to measure the piezo-electric characteristics of the respective piezoelectric ceramic compositions 1 having the composition Nos. 1 to 9 shown in Table 1, the respective compositions were placed in a pyrostat and the temperature was varied in a range between a normal temperature (25° C.) and 150° C. At each measured temperature, a compressive load of 100 kgf was applied in the direction of polarization, and the quantity of charge generated at this time was measured by a charge amplifier. Table 2 shows the piezoelectric constants at 25° C., the temperature-dependent change rates (the change rate of the respective piezoelectric constants corresponding to temperature changes whithin the range between 25° C. and 150° C.), and temperatures at which the dielectric constant of each composition shows the maximum value, namely, Curie temperatures. In addition, FIG. 2 shows the relation between the temperature-dependent change rates of the piezoelectric constants and the Curie temperatures with respect to the quantity of CaTiO$_3$ added.

Figure 2:
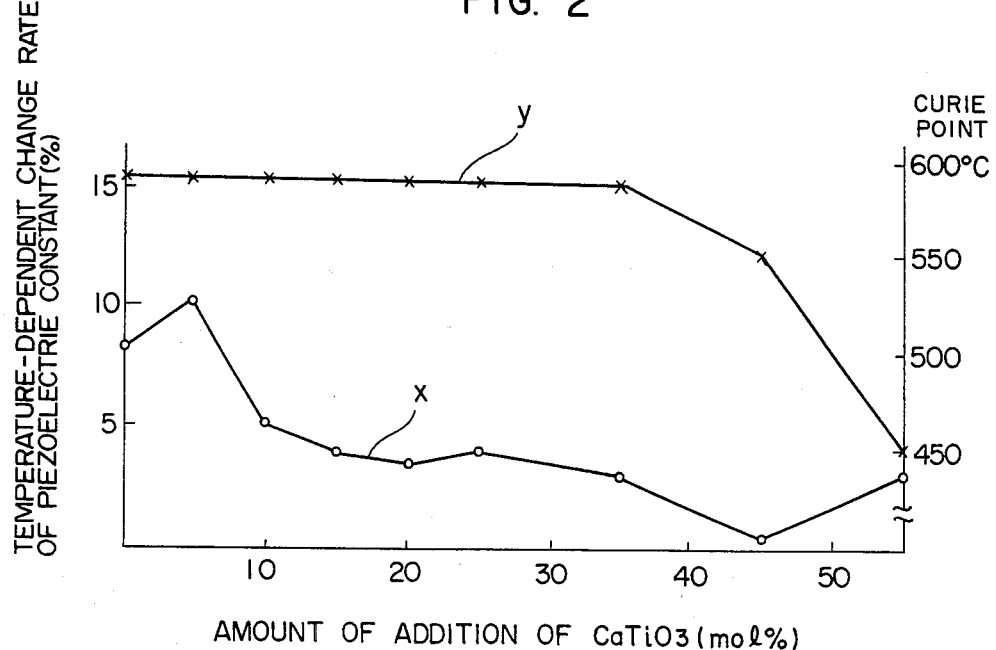
FIG. 2 is a chart of characteristics illustrating the changes in the following three factors: the content of $CaTiO_3$, the temperature-dependent characteristic of the piezoelectric constant, and the Curie temperature.

As will be seen in FIG. 2, the rate of temperature-dependent changes of the piezoelectric constant (a characteristic curve x shown in FIG. 2) shows a general tendency to decrease as the quantity of CaTiO$_3$ added increases. At the point where 45% mol is added, the temperature-dependent change rate shows a minimum value, and subsequently, as the quantity added increases, this rate increases again.

On the other hand, the Curie temperature (the characteristic curve y shown in FIG. 2) shows little variation up to the point of the 35 mol % addition of CaTiO$_3$, but when the quantity added passes above this point, the Curie temperature starts to decrease.

TABLE 2

| No. | RAW MATERIAL | | |
|---|---|---|---|
| | PIEZO-ELECTRIC CONSTANT (25° C.) | TEMPERATURE-DEPENDENT CHANGE RATE (25-150° C.) | CURIE TEMPERATURE |
| 1 | 21 PC/N | 8% | 580° C. |
| 2 | 16 | 10 | 580 |
| 3 | 16 | 5 | 580 |
| 4 | 22 | 4 | 580 |
| 5 | 19 | 3.5 | 580 |
| 6 | 18 | 4 | 580 |
| 7 | 15 | 3 | 580 |
| 8 | 15 | 0.5 | 550 |
| 9 | 13 | 3 | 450 |

Figure 3:
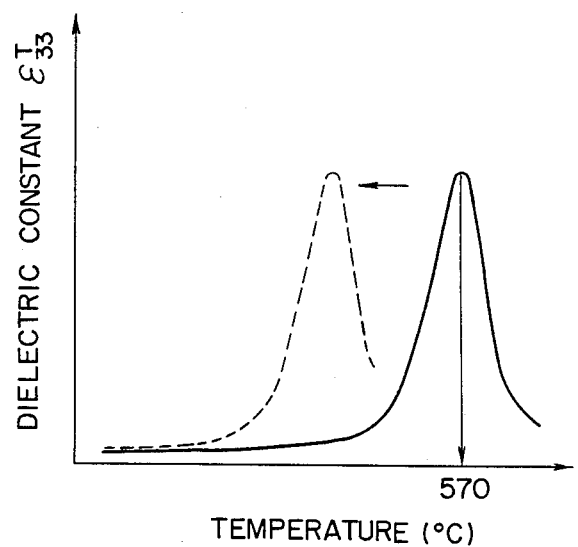
FIG. 3 is a chart of characteristics illustrating temperature-dependent changes in the dielectric constant of the piezoelectric ceramic composition of this invention.

Referring to the relationship between the dielectric constant and the temperature characteristic, the composition having a Curie temperature of 570° C., for example, has a characteristic curve which exhibits a sharp rise at 570° C. as indicated by the solid line shown in FIG. 3. Along the flat portion of the characteristic curve between the normal temperature and the Curie temperature, the change rate of the dielectric constant is not significantly affected by temperature changes. Therefore, since the temperature-dependent change of the piezoelectric constant becomes correspondingly small, as the flat portion continues to a higher temperature, a pressure detecting element which may have such a characteristic can be used up to a higher temperature region.

Considering again FIG. 2, when CaTiO$_3$ is at 45 mol %, the change rate of the dielectric constant with respect to temperature changes from 25° C. to 150° C. takes a value near 0, and within this temperature range a pressure detecting element can be obtained which is not substantially affected by temperature changes. In judging from FIG. 2, a practicable content of CaTiO$_3$ is preferably not less than 10 mol % but not more than 55% where the temperature-dependent change rate of the piezoelectric constant is less than 5% and the Curie temperature is not lower than 450° C.

It should be noted that, according to X-ray diffraction, is a case where the quantity of CaTiO$_3$ added is not more than about 45 mol %, PbBi$_4$Ti$_4$O$_{15}$ exists in a single phase wherein it is estimated that CaTiO$_3$ is contained in PbBi$_4$Ti$_4$O$_{15}$ in the form of a solid solution. When the quantity added becomes more than 45 mol %, PbBi$_4$Ti$_4$O$_{15}$ and CaTiO$_3$ exist in two phases, so that the characteristics seem to have been as shown in FIG. 2.

Table 3 shows a raw material composition which contains SrTiO$_3$ as an added substance, and Table 4 shows the piezoelectric constants, the temperature-dependent change rates and the Curie temperatures as to each composition containing SrTiO$_3$ which are measured in the same manner as the measurement of CaTiO$_3$. In addition, FIG. 4 shows the relationship between the quantity of SrTiO$_3$ added and the temperature-dependent change rates (the characteristic curve x' shown in FIG. 4) and the relationship between the quantity added and the Curie temperature (the characteristic curve y' shown in FIG. 4).

Figure 4:
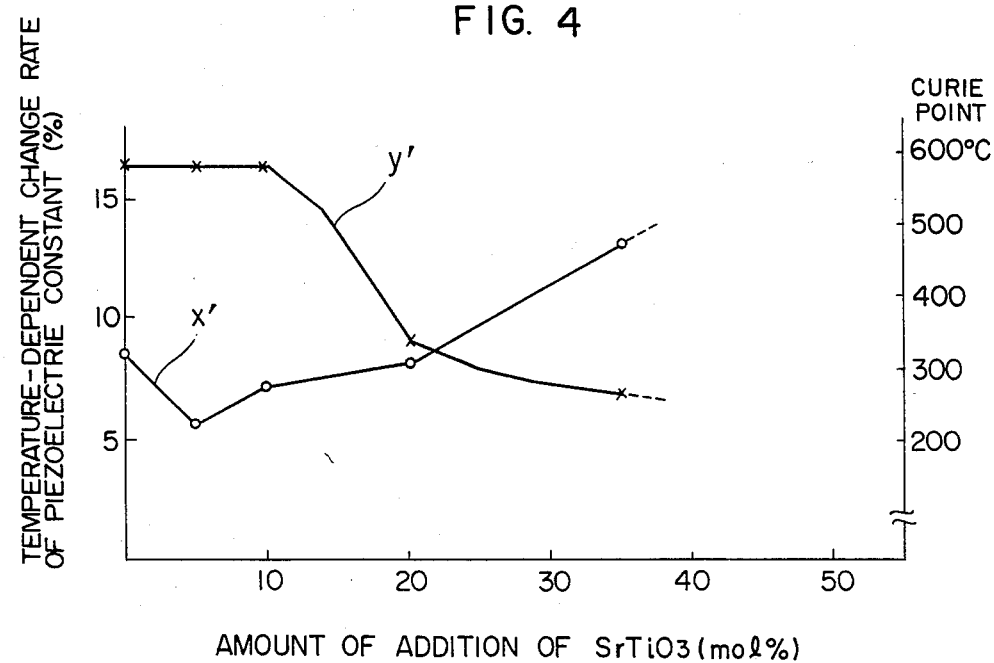
FIG. 4 is a chart of characteristics illustrating changes in the following three factors: the content of $SrTiO_3$ in a ferroelectric substance having a bismuth layer structure containing $SrTiO_3$; the temperature characteristic of the piezoelectric constant; and the Curie temperature.

As will be readily understood from FIG. 4, the temperature characteristics of the piezoelectric constant of SrTiO$_3$ is similar to that of CaTiO$_3$. Specifically, as the quantity of SrTiO$_3$ added is first increased, the temperature-dependent change rate decreases inversely, and when the quantity added is 5 mol %, the characteristic curve shows its minimum value.

TABLE 3

| | RAW MATERIAL | | | | | |
|---|---|---|---|---|---|---|
| No. | PbO (g) | Bi$_2$O$_3$ (g) | TiO$_2$ (g) | MnCO$_3$ (g) | SrTiO$_3$ (g) | SrTiO$_3$ (mol %) |
| 1 | 300.7 | 1255.8 | 430.6 | 6.4 | 13.0 | 5 |
| 2 | 298.6 | 1246.7 | 427.5 | 6.4 | 27.3 | 10 |
| 3 | 293.6 | 1225.8 | 420.3 | 6.3 | 60.3 | 20 |
| 4 | 283.7 | 1184.5 | 406.3 | 6.1 | 125.6 | 35 |

TABLE 4

| | RAW MATERIAL | | |
|---|---|---|---|
| No. | PIEZOELECTRIC CONSTANT (25° C.) | TEMPERATURE CHARACTERISTIC (25–150° C.) | CURIE TEMPERATURE |
| 1 | 28 PC/N | 5% | 580° C. |
| 2 | 28 | 7 | 580 |
| 3 | 26 | 8 | 340 |
| 4 | 20 | 13 | 270 |

Subsequently, as the quantity added increases further, the value of characteristic curve increases.

Referring to the Curie temperature shown in FIG. 4, when the quantity added exceeds 10 mol %, the Curie temperature starts to decrease abruptly. Since this abrupt decrease causes the maximum value of the dielectric constant to be shifted to the side of a lower temperature, the temperature-dependent characteristic of the dielectric constant becomes large as shown in FIG. 3. Accordingly, for the purpose of improving the temperature-dependent characteristic of the dielectric constant without causing a serious decrease in the Curie temperature and the piezoelectric constant, the quantity added is suitably 1 to 15 mol %.

It should be noted that, according to X-ray diffraction, in a case where the quantity of SrTiO$_3$ added is not more than 20 mol %, it is estimated that PbBi$_4$Ti$_4$O$_{15}$ exists in a single phase wherein SrTiO$_3$ is present in PbBi$_4$Ti$_4$O$_{15}$ in the form of a solid solution. According to the X-ray diffraction with respect to the specimen of 35 mol %, it has been confirmed that SrTiO$_3$ and PbBi$_4$Ti$_4$O$_{15}$ appear in two phases, and it is considered that the characteristics shown in FIG. 4 were obtained on this basis.

It is a matter of course that while CaTiO$_3$ or SrTiO$_3$ as an added substance of the present invention may be added directly in the form of CaTiO$_3$ or SrTiO$_3$, other compounds may be added which, for example, become CaTiO$_3$ or SrTiO$_3$ on oxidation during heating and sintering. For instance, Ca, Sr and Ti may be added in the form of an oxide, an oxalate, a carbonate and a hydroxide so as to obtain a predetermined content of CaTiO$_3$ or SrTiO$_3$.

In the above-described embodiment, MnO is added so as to adjust the specific resistance of the piezo-electric ceramic composition to the level of $10^{12}$ to $10^{13}$ Ω·cm in such a manner as obtaining a suitable pressure detecting element, but an oxide of Cr and Fe may be added in place of MnO. However, even in a case where no additional substance such as MnO is added, the specific resistance is relatively large, and similarly, it has been confirmed that it is possible to obtain the tendency as shown in FIGS. 2 and 3 with respect to such factors as the temperature-dependent change rate of the piezo-electric constant.

In addition, since the piezoelectric ceramic composition of the present invention shows a dielectric constant which is stable up to a high temperature region, impedance is not lowered even at high temperatures. Thus this composition is superior in property of matching a high frequency wave even during high temperature service, with the result that the composition of this invention can suitably be employed as a high frequency filter for use under high-temperature conditions.

Moreover, the piezoelectric ceramic composition of this invention shows a stable low dielectric constant up to a high temperature region, and the piezoelectric constant is hence stable with respect to temperature changes also and can suitably be used as an element for a high-temperature metal flaw detector.

It will be understood that the foregoing disclosure of a preferred embodiment of the present invention is for purposes of illustration only, and that the features disclosed may be modified and changed in a number of ways none of which involves any departure from the spirit and scope of the invention as defined in the hereto appended claim.

What is claimed is:

1. A piezoelectric ceramic composition consisting essentially of:
    an additive selected from the group consisting of 10–55 mol % CaTiO$_3$ and 1–15 mol % SrTiO$_3$, and the balance of the composition is PbBi$_4$Ti$_4$O$_{15}$ having a Bi-layer structure.

2. The piezoelectric ceramic composition according to claim 1, wherein said additive is 10–55 mol % of $CaTiO_3$.

3. The sintered piezoelectric ceramic composition having a bismuth layer structure consisting essentially of an additive selected from the group consisting of 10 to 55 mol % $CaTiO_3$, and 1 to 15 mol % $SrTiO_3$; and the balance $PbBi_4Ti_4O_{15}$.

4. The piezoelectric ceramic composition comprising: an additive selected from the group consisting of 10–55 mol % of $CaTiO_3$ and 1–15 mol % of $SrTiO_3$; 0.005 to 0.7 wt % of another additive selected from the group consisting of manganese oxide, chromium oxide and iron oxide; and the balance of the composition being $PbBi_4Ti_4O_{15}$ whereby the value of the specific resistance of said composition is in the range of $10^{12}$–$10^{13}$ $\Omega$ cm.

5. The piezoelectric ceramic composition according to claim 4, wherein said another additive is manganese oxide.

6. The sintered piezoelectric ceramic composition having a bismuth layer structure consisting essentially of an additive selected from the group consisting of 10–55 mol % $CaTio_3$ and 1–15 mol % $SrTiO_3$; 0.005 to 0.7 wt % of a further additive selected from the group consisting of manganese oxide, chromium oxide and iron oxide and the balance $PbBi_4Ti_4O_{15}$ whereby the value of the specific resistance of said structure is in a range of $10^{12}$–$10^{13}$ $\Omega$ cm.

7. The piezoelectric ceramic composition according to claim 1 consisting essentially of 1–20 mol % of $SrTiO_3$ in solid-solution in $PbBi_4Ti_4O_{15}$.

8. The piezoelectric ceramic composition according to claim 7, wherein said composition contains 1–15 mol % of $SrTiO_3$ in solid-solution in $PbBi_4Ti_4O_{15}$.

9. The sintered piezoelectric ceramic structure according to claim 3, wherein said structure is used as a pressure detector.

10. The sintered piezoelectric ceramic structure according to claim 3, wherein the rate of change in the piezoelectric constant due to change in temperature is not more than 5% and the Curie temperature of said structure is not less than 450° C.

11. The sintered piezoelectric ceramic structure according to claim 6, wherein said structure is used as a high frequency filter used in a high temperature environment.

12. The sintered piezoelectric ceramic structure according to claim 3, wherein said structure is used as an element for a flaw detector for metal usable at a high temperature.

13. A piezoelectric ceramic composition consisting essentially of 10–45 mol % $CaTiO_3$ in solid-solution in $PbBi_4Ti_4O_{15}$.

14. A piezoelectric ceramic composition consisting essentially of:
an additive having a negative dielectric constant-temperature characteristic, said additive being selected from the group consisting of 10–55 mol % $CaTiO_3$ and 1–15 mol % $SrTiO_3$, and
the balance of the composition being $PbBi_4Ti_4O_{15}$ having a Bi-layer type structure which $PbBi_4Ti_4O_{15}$ has a positive dielectric constant-temperature characteristic,
a change in the dielectric constant of the $PbBi_4Ti_4O_{15}$ which change occurs by a change in temperature being substantially compensated for by a dielectric constant change of the additive occurring by temperature change so that said composition has a sunstantially constant dielectric constant irrespective of a change in temperature.

* * * * *